(12) United States Patent
Miller et al.

(10) Patent No.: US 6,271,052 B1
(45) Date of Patent: Aug. 7, 2001

(54) PROCESS FOR INTEGRATING DIELECTRIC OPTICAL COATINGS INTO MICRO-ELECTROMECHANICAL DEVICES

(75) Inventors: Michael F. Miller, Hollis, NH (US); Minh Van Le, Methuen, MA (US); Christopher C. Cook, Bedford, MA (US); Dale C. Flanders, Lexington, MA (US)

(73) Assignee: Axsun Technologies, Inc., Billerica, MA (US)

( * ) Notice: Subject to any disclaimer, the term of this patent is extended or adjusted under 35 U.S.C. 154(b) by 0 days.

(21) Appl. No.: 09/692,639

(22) Filed: Oct. 19, 2000

(51) Int. Cl.[7] ............................................ H01L 21/00
(52) U.S. Cl. ........................................................ 438/50
(58) Field of Search ............................ 438/97, 48, 50, 438/712; 257/417

(56) References Cited

U.S. PATENT DOCUMENTS

| 5,963,788 | 10/1999 | Barron et al. | 438/48 |
| 6,174,820 | * 1/2001 | Habermehl et al. | 438/745 |
| 6,178,284 | * 1/2001 | Bergmann et al. | 385/140 |

* cited by examiner

Primary Examiner—David Nelms
Assistant Examiner—Quoc Hoang
(74) Attorney, Agent, or Firm—J. Grant Houston

(57) ABSTRACT

A process for fabricating an optical membrane from polycrystalline silicon comprises first forming a sacrificial layer on a handle wafer. Concavities are etched into the sacrificial layer. Polycrystalline silicon membrane layer is then formed on the sacrificial layer. The polycrystalline membrane layer is subsequently polished to achieve the predetermined membrane thickness and surface smoothness, annealed, and then patterned. Finally, the sacrificial layer is removed to release the membrane. The concavities in the sacrificial layer yield convexities in the polysilicon layer to prevent stiction adhesion to the handle wafer. During processing, a mask used to pattern the membrane layer functions to protect an highly reflecting (HR) coating for the membrane.

35 Claims, 5 Drawing Sheets

PROCESS FOR INTEGRATING DIELECTRIC OPTICAL COATINGS INTO MICRO-ELECTROMECHANICAL DEVICES

BACKGROUND OF THE INVENTION

Micro-electromechanical system (MEMS) membranes are used in a number of different optical applications. For example, they can be coated to be reflective to highly reflective and then paired with a stationary mirror to form a tunable Fabry-Perot (FP) cavity/filter. It can also be used to define the end of a laser cavity. By deflecting the membrane, the spectral location of the cavity modes can be controlled.

The MEMS membrane is typically produced by etching features into a layer of material to form the pattern of the membrane. An underlying sacrificial layer is subsequently etched away to produce a suspended structure in a release process. Often the structural layer is silicon and the sacrificial layer is silicon dioxide. The silicon dioxide can be preferentially etched in hydrofluoric acid. The membranes can be constructed from various other material systems. In some cases, alternating layers of high and low index material are used to create a membrane.

Typically, membrane deflection is achieved by applying a voltage between the membrane and a fixed electrode. Electrostatic attraction deflects the membrane in the direction of the fixed electrode as a function of the applied voltage. This effect changes the reflector separation in the FP filter or cavity length in the case of a laser. Movement can also be provided by thermal or other actuation mechanism.

The high reflectivity coatings (R>98%) and/or coatings in which the reflectivity varies as a function of wavelength (e.g., dichroism) require dielectric optical coatings. The optics industry has developed techniques to produce these high performance coatings and has identified a family of materials with well-characterized optical and mechanical properties. These coatings typically include alternating layers of high and low index materials. Candidate materials include silicon dioxide, titanium dioxide and tantalum pentoxide. These coatings are usually quite thick, greater than 3 micrometers (um).

SUMMARY OF THE INVENTION

A challenge in the production of optical MEMS devices that requires dielectric optical coatings is to develop a device design and corresponding fabrication sequence that contemplates the integration of these materials.

The present invention concerns a process for patterning dielectric layers of the type typically found in optical coatings in the context of MEMS membrane manufacturing. More specifically, an etching process, such as dry reactive ion etching (RIE), is employed. A mask layer is then applied to protect the dielectric coating during subsequent processing steps, such as release process for example.

The primary advantage of photolithographic patterning of the dielectric layers in optical MEMS devices is that higher levels of consistency can be achieved in fabrication, such as size and residual stress. Competing techniques such as shadow masking yield lower quality features and are difficult to align. Further, the minimum feature size that can be obtained with shadow masks is limited to ~100 um, depending on the coating system geometry, and they require hard contact with the surface of the wafer, which can lead to damage and/or particulate contamination. Lift-off of dielectric layers has been demonstrated, although this process gets more difficult for thick dielectric layers. Furthermore, optical coatings are typically deposited in an electron-beam evaporator with elevated substrate temperatures (200 C.) and with ion assist. Both of these factors complicate the use of photoresist as a lift-off layer.

Further advantages of the proposed patterning sequence are that the coating can be applied conformally over the surface of the wafer. The deposition systems used for optical coatings generally do not conform to the same standards of cleanliness as semiconductor processing tools. Applying a conformal coating to the surface of a plain wafer allows the material to undergo standard clean processes (RCA, piranha, etc) prior to be processed in other tools. Thus, the risk of contamination can be managed effectively. These cleaning steps can be repeated after the etching of the dielectric film to form the patterned features.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

FIGS. 1A through 1I illustrate a process for fabricating a membrane with optical coating, which utilizes principles of the present invention.

Figure 1A:
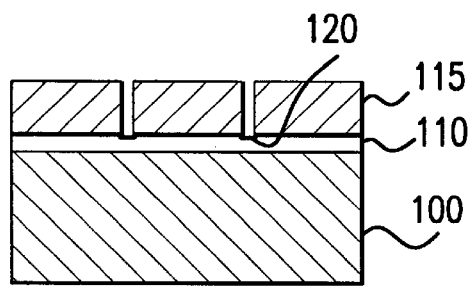
FIGS. 1A through 1I are schematic cross-sectional and top views illustrating fabrication of one embodiment of the membrane of the present invention.

Referring to FIG. 1A, the process begins with a support or handle wafer 100, which in one embodiment is a standard n-type doped silicon wafer. The handle wafer 100 is 75 mm to 150 mm in diameter and is 400 to 500 microns thick in one implementation.

The wafer 100 is oxidized to form a sacrificial oxide layer 110. This oxide layer 110 has a depth of typically 2 to 4 microns. The photoresist layer 115 is then deposited over the oxide layer 110 and patterned to expose regions of the oxide layer 110 around a future location of the optical port. The exposed regions of the oxide sacrificial layer 110 are then etched in a buffered oxide etch to form a ring of concavities 120 in the sacrificial layer 110 surrounding the location of the optical port.

Figure 1B:
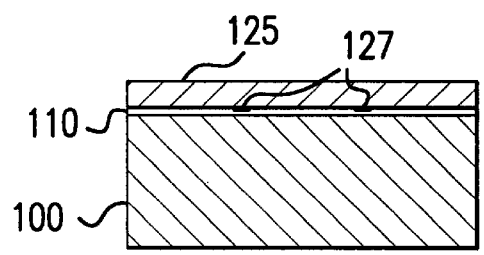

As shown in FIG. 1B, the photoresist layer 115 is removed and a polycrystalline silicon membrane layer 125 is deposited over the sacrificial layer 110. The polysilicon layer is deposited to a thickness of typically greater than 6 to 10 microns, in a low-pressure chemical vapor deposition process. During doping, typically a dopant, such as n-type, is added to improve conductivity while controlling the crystallinity and density of the polysilicon. The polysilicon fills into the concavities 120 in the sacrificial oxide layer 110, resulting in convexities 127 in the polysilicon layer 125.

In an alterative process, a silicon membrane wafer such as silicon is bonded to the oxide layer using elevated temperature and pressure. In this process, there is no need to etch the concavities as illustrated in FIG. 1A.

After deposition or bonding, the polysilicon or silicon layer 125 is annealed and polished back to the desired membrane thickness, such as 6 to 10 microns.

Figure 1C:
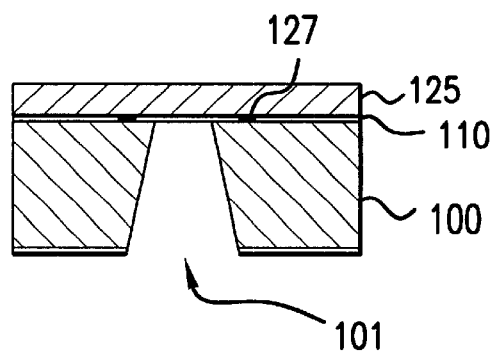

As shown in FIG. 1C, an optical port 101 is patterned and etched into the handle or support wafer 100, preferably using a combination of isotropic and anisotropic etching. The sacrificial oxide layer 110 is used as an etch stop. Alternatively, the optical port etch step can be omitted, as silicon is partially transparent at infrared wavelengths, in which case an anti-reflective (AR) coating is applied to the outer surface of handle wafer 100 to minimize reflection from the air-silicon interface.

Figure 1D:
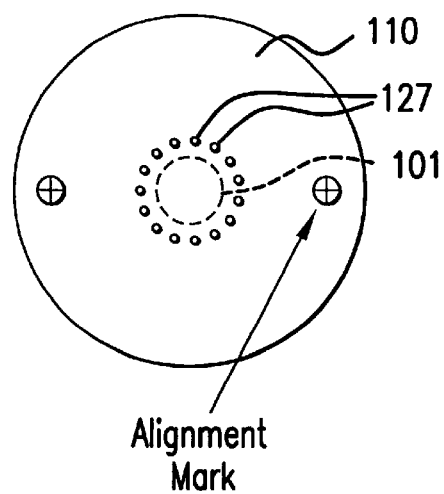

FIG. 1D is a top plan view of the polysilicon membrane layer 110 showing the relationship of the optical port 101 and the convexities 127 that ring the region of the port.

Figure 1E:
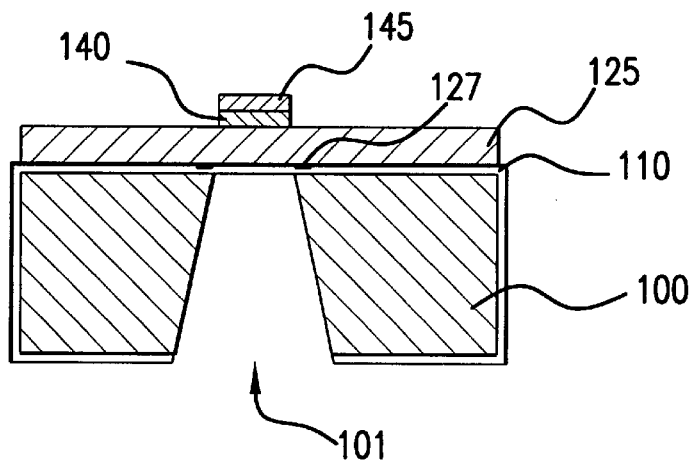

FIG. 1E shows the deposition and patterning of a highly reflective (HR) coating 140. Specifically, the HR coating 140 is deposited and etched back using a patterned photoresist layer 145. The HR coating is preferably a multi-layer coating of 4 more layers, preferably 8 or more, with a 16 dielectric layer mirror being used in the current embodiment. The preferred method of etching the dielectric coatings 140 is to use a dry etch process, such as reactive ion etching and reactive ion milling. Films with a thickness of 3 to 4 $\mu$m have been etched with a photoresist mask provided adequate backside cooling is employed. The etch chemistry is based on CHF3/CF4/Ar. Ion beam milling is an alternative, but the etch times for this process are much longer.

The etch of the HR coating 140 leaves the reflector in the region of the optical port 101.

Figure 1F:
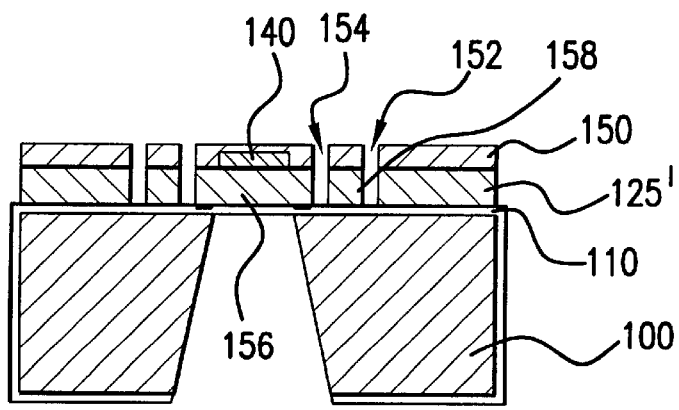

FIG. 1F shows the formation of the tether structure in the polysilicon membrane layer 125. Specifically, a photoresist layer 150 is deposited and patterned with the tether pattern. It also functions to protect the HR coating 140 during the polysilicon etch. Voids 152 and 154 are formed in the polysilicon layer to form the membrane with its tether structure.

Protection of the dielectric coatings during release is required since materials such as silicon dioxide, titanium dioxide and tantalum pentoxide are etched by hydrofluoric acid. As shown, photoresist layer 150 is used both as a mask for the patterning step and for protection during the release step.

A metal mask, such as nickel, is substituted for the photoresist in the preceding steps in one embodiment. To achieve good side-wall coverage, as required for a protection mask, a sputtering system is preferred for this deposition step. For the release step, a metal mask could allow the use of concentrated hydrofluoric acid, shortening the etch times considerably. If a metal mask is used, then it must be stripped after release. For example, a wet etch step for removing the metal mask could be inserted immediately after release.

Figure 1H:
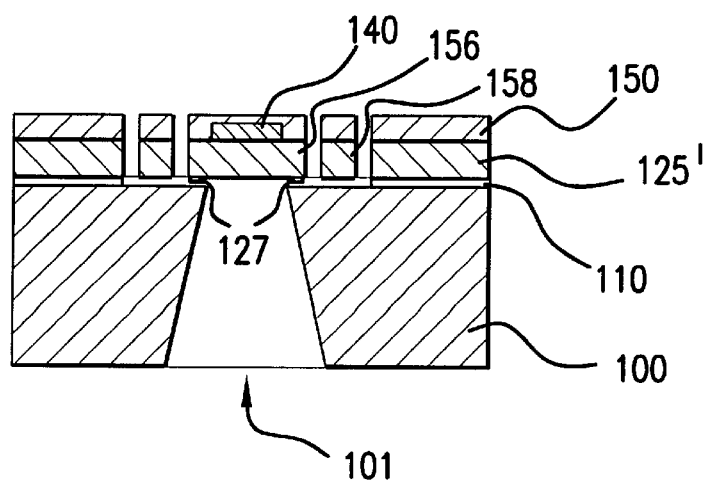
Figure 1G:
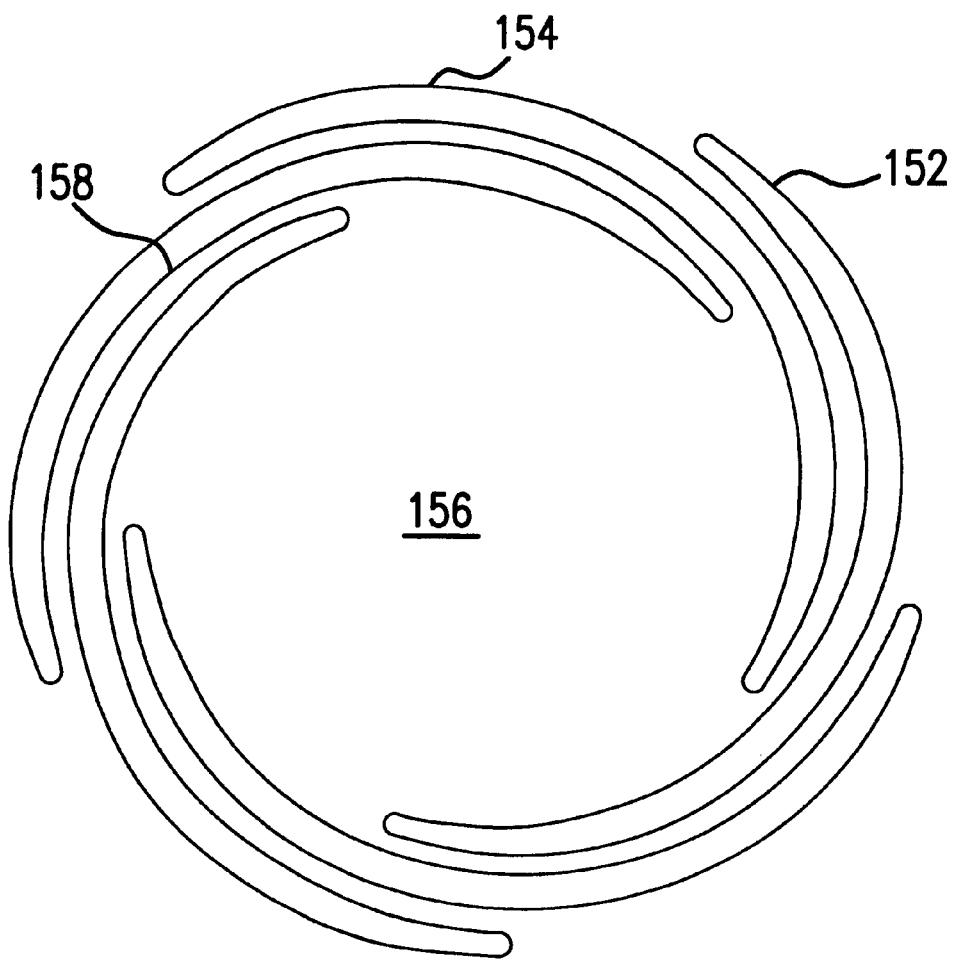
Figure 1I:
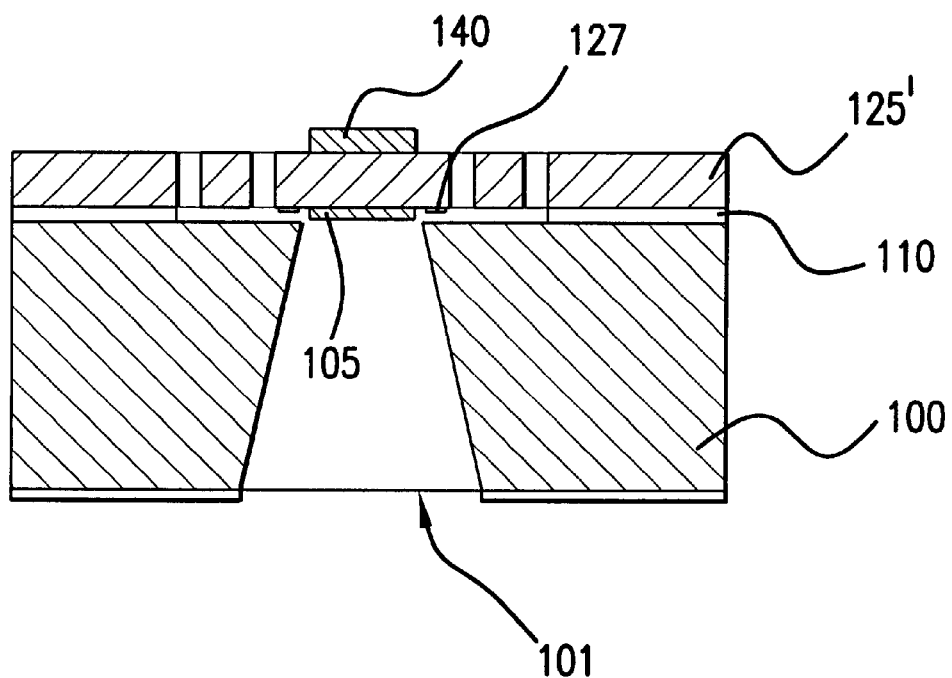

FIG. 1G is a top view showing one membrane-tether configuration. The patterned polysilicon membrane 125' comprises a center body portion 156 that is aligned over the optical port 101 and tethers 158 formed by the removal of polysilicon from voids or regions 152, 154.

FIG. 1H shows the subsequent step in which the sacrificial layer 110 is partially removed in an isotropic oxide etch to "release" the membrane and tether structure from the sacrificial oxide layer 10 and handle wafer 100. In one embodiment, concentrated HF etch, followed by methanol, followed by a drying step using supercritical carbon dioxide is used.

For this release step, the metal mask could allow the use of concentrated hydrofluoric acid, shortening the etch times considerably. If a metal mask is used, then it must be stripped after release. For example, a wet etch step for removing the metal mask could be inserted immediately after release.

Another protection scheme is to deposit a mask layer that functions as a protection mask as well as be incorporated into the overall optical function of the coating, eliminating the need to remove the mask layer after release. For example, two candidate materials are amorphous silicon or silicon nitride. In this process, the dielectric film is deposited conformally over the surface; but the coating design is adjusted in anticipation of an additional layer. The features are etched using the dry etch process as before. An additional conformal layer is deposited over the entire surface of the wafer. Sputtering or a plasma enhanced chemical vapor deposition (PECVD) systems provide the best conformal coverage. However, an e-beam evaporator with a planetary system is an alternative. The optical design of the coating is tailored so that its performance was not sensitive to the thickness of this last layer, eliminating the need for precise control of the deposition rate. This final mask layer is patterned using a dry or wet etch process if it were desirable to reduce the area over which it extended. For example, it may be necessary to reduce the area to that immediately surrounding the dielectric coating so that it does not influence the mechanical properties of the MEMS structure.

As shown in FIG. 1J, an anti-reflection (AR) coating 105 is deposited through the optical port 101 onto the exterior surface of the membrane. Both of these coatings are designed for the wavelength bands of interest.

The convexities 127 of the polysilicon membrane layer 125' project from the membrane in the direction of the handle wafer. Thus, if an over-voltage is established between the handle wafer 100 and the membrane 125'and the membrane contacts the handle wafer, the contact will be at the peaks of the convexities 127.

The convexities 127 prevent stiction induced attachment of the membrane 125' to the handle wafer, if an over-voltage condition, for example, should occur. The most common definition for stiction is the strong interfacial adhesion present between contacting crystalline microstructure surfaces. The term has also evolved to include sticking problems such as contamination, friction driven adhesion, and humidity driven capillary forces on oxide surface. Generally, stiction is the unintentional adhesion of MEMS surfaces. Generally stiction forces increase with contact area. The convexities 127 reduce the effective contact area to reduce the risk of membrane-wafer attachment.

Figure 2:
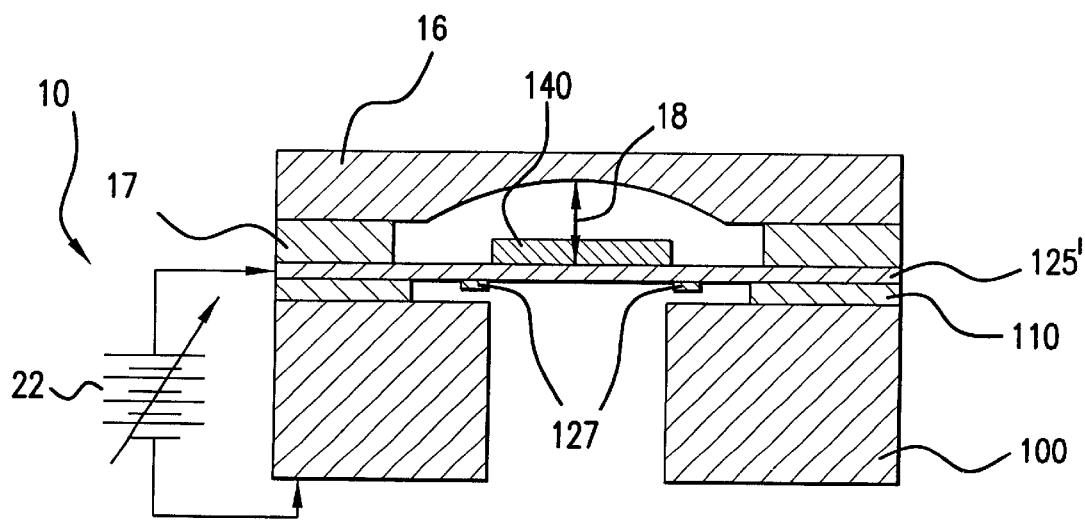
FIG. 2 is a schematic cross-sectional view of an implementation of the HR coated membrane.

FIG. 2 shows one application of the polysilicon membrane 125'. Specifically, it is paired with a reflector 16 to form a FP cavity 18. Specifically, the filter 10 includes three main functional components, including the handle wafer 100, a moving membrane reflector 125', and a concave, e.g., spherical, cavity reflector 16, which can be separated from the membrane via a spacer layer 17. These functional layers are held together and operated as a tunable FPF by modulating voltage 22 between the handle wafer and the membrane.

According to another embodiment, the membrane 125' is placed at the end of a laser cavity to modulate the cavity length.

Generally, the packing density is of the membrane layer is controlled during deposition to minimize the stress in the polycrystalline layer 125 to create a flat membrane when released. In other embodiments, either a tensile or compressive forces are promoted in the polycrystalline layer 125 so after subsequent release, the membrane forms a concave or convex surface to thereby form a concave reflector of a laser cavity resonator or Fabry-Perot filter.

While this invention has been particularly shown and described with references to preferred embodiments thereof, it will be understood by those skilled in the art that various changes in form and details may be made therein without departing from the scope of the invention encompassed by the appended claims. For example, in the particular process flow shown, the optical port is patterned into the backside of the wafer prior to the deposition of the dielectric film on the front side. Executing this step prior to depositing the optical coatings is not necessary. For example, the dielectric could be applied to a plain SOI wafer and patterned prior to etching the optical port. The protection methods would be essentially unchanged. For other devices, the point at which the dielectric film is patterned could be adjusted to optimize the overall process flow.

What is claimed is:

1. A process for fabricating a membrane with an optical coating, the process comprising:
   forming a membrane layer;
   depositing a high reflectivity (HR) coating on the membrane layer;
   patterning the HR coating with a dry etch process to reside at least over a portion of an optical port region of the membrane layer;
   patterning the membrane layer to form the membrane; and
   removing at least part of a sacrificial layer to release the membrane.

2. A process as claimed in claim 1, wherein the step of removing the sacrificial layer is performed after the patterning of the HR coating.

3. A process as claimed in claim 1, wherein the step of patterning the HR coating comprises depositing and developing a photoresist layer.

4. A process as claimed in claim 1, further comprising protecting the HR coating during the step of patterning the membrane.

5. A process as claimed in claim 4, wherein in the step of protecting the HR coating comprises covering the HR coating with a photoresist layer that is used in the patterning of the membrane layer.

6. A process as claimed in claim 4, wherein in the step of protecting the HR coating comprises covering the HR coating with amorphous silicon that is used in the patterning of the membrane layer.

7. A process as claimed in claim 4, wherein in the step of protecting the HR coating comprises covering the HR coating with silicon nitride that is used in the patterning of the membrane layer.

8. A process as claimed in claim 4, wherein in the step of protecting the HR coating comprises covering the HR coating with a metal that is used in the patterning of the membrane layer.

9. A process as claimed in claim 1, further comprising polishing the polycrystalline silicon membrane layer to achieve a predetermined depth and surface smoothness.

10. A process as claimed in claim 1, wherein the membrane layer comprises polycrystalline silicon.

11. A process as claimed in claim 1, wherein the reflectivity of the HR coating is greater than 96%.

12. A process as claimed in claim 1, wherein the reflectivity of the HR coating is greater than 99%.

13. A process as claimed in claim 1, further comprising installing the membrane at one end of a laser cavity.

14. A process as claimed in claim 1, further comprising installing the membrane opposite a stationary reflector to form a tunable Fabry-Perot filter.

15. A process for fabricating a membrane with an optical coating, the process comprising:
    forming a membrane layer;
    depositing a high reflectivity (HR) coating on the membrane layer;
    patterning the HR coating with reactive ion etching to reside at least over a portion of an optical port region of the membrane layer;
    patterning the membrane layer to form the membrane; and
    removing at least part of a sacrificial layer to release the membrane.

16. A process as claimed in claim 15, wherein the step of removing the sacrificial layer is performed after the patterning of the HR coating.

17. A process as claimed in claim 15, wherein the step of patterning the HR coating comprises depositing and developing a photoresist layer.

18. A process as claimed in claim 15, further comprising protecting the HR coating during the step of patterning the membrane.

19. A process as claimed in claim 18, wherein in the step of protecting the HR coating comprises covering the HR coating with a photoresist layer that is used in the patterning of the membrane layer.

20. A process for fabricating a membrane with an optical coating, the process comprising:
    forming a membrane layer;
    depositing a high reflectivity (HR) coating on the membrane layer;
    patterning the HR coating with reactive ion milling to reside at least over portion of an optical port region of the membrane layer;
    patterning the membrane layer to form the membrane; and
    removing at least part of a sacrificial layer to release the membrane.

21. A process as claimed in claim 20, wherein the step of removing the sacrificial layer is performed after the patterning of the HR coating.

22. A process as claimed in claim 20, wherein the step of patterning the HR coating comprises depositing and developing a photoresist layer.

23. A process as claimed in claim 20, further comprising protecting the HR coating during the step of patterning the membrane.

24. A process as claimed in claim 23, wherein in the step of protecting the HR coating comprises covering the HR coating with a photoresist layer that is used in the patterning of the membrane layer.

25. A process for fabricating a membrane with an optical coating, the process comprising:
    forming a membrane layer;
    depositing a high reflectivity (HR) coating on the membrane layer;
    patterning the HR coating to reside at least over a portion of an optical port region of the membrane layer wherein the HR has 4 or more dielectric layers;
    patterning the membrane layer to form the membrane; and
    removing at least part of a sacrificial layer to release the membrane.

26. A process as claimed in claim 25, wherein the step of removing the sacrificial layer is performed after the patterning of the HR coating.

27. A process as claimed in claim 25, wherein the step of patterning the HR coating comprises depositing and developing a photoresist layer.

28. A process as claimed in claim 25, further comprising protecting the HR coating during the step of patterning the membrane.

29. A process as claimed in claim 28, wherein in the step of protecting the HR coating comprises covering the HR coating with a photoresist layer that is used in the patterning of the membrane layer.

30. A process for fabricating a membrane with an optical coating, the process comprising:

forming a membrane layer;

depositing a high reflectivity (HR) coating on the membrane layer;

patterning the HR coating to reside at least over a portion of an optical port region of the membrane layer wherein the HR coating has 8 or more dielectric layers;

patterning the membrane layer to form the membrane; and removing at least part of a sacrificial layer to release the membrane.

31. A process as claimed in claim 30, wherein the step of removing the sacrificial layer is performed after the patterning of the HR coating.

32. A process as claimed in claim 30, wherein the step of patterning the HR coating comprises depositing and developing a photoresist layer.

33. A process as claimed in claim 30, further comprising protecting the HR coating during the step of patterning the membrane.

34. A process as claimed in claim 33, wherein in the step of protecting the HR coating comprises covering the HR coating with a photoresist layer that is used in the patterning of the membrane layer.

35. A process for fabricating a membrane with an optical coating, the process comprising:

forming a membrane layer;

depositing a high reflectivity (HR) coating on the membrane layer;

patterning the HR coating to reside at least over a portion of an optical port region of the membrane layer wherein the HR coating has 16 or more dielectric layers;

patterning the membrane layer to form the membrane; and removing at least part of a sacrificial layer to release the membrane.

* * * * *